United States Patent
Chen et al.

(10) Patent No.: US 7,292,438 B2
(45) Date of Patent: *Nov. 6, 2007

(54) LIQUID-COOLING HEAT DISSIPATION MODULE

(75) Inventors: Lee-Long Chen, Taoyuan Hsien (TW); Chien-Hsiung Huang, Taoyuan Hsien (TW); Yu-Hsien Lin, Taoyuan Hsien (TW); Chin-Ming Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 169 days.

This patent is subject to a terminal disclaimer.

(21) Appl. No.: 11/189,870

(22) Filed: Jul. 27, 2005

(65) Prior Publication Data

US 2006/0193115 A1  Aug. 31, 2006

(30) Foreign Application Priority Data

Feb. 25, 2005 (TW) ............................... 94105753 A
Feb. 25, 2005 (TW) ............................... 94105754 A
Mar. 11, 2005 (TW) ............................... 94107506 A (51) Int. Cl.
*H05K 7/20* (2006.01)

(52) U.S. Cl. .................. 361/699; 361/696; 361/697; 361/698; 361/701; 165/80.3; 165/80.4; 165/104.33; 62/259.2

(58) Field of Classification Search ................ 361/687, 361/690, 695–699, 717–719; 62/259.2; 257/715–716, 257/714, 722; 165/80.3, 80.4, 104.33, 104.28, 165/104.34, 104.31; 417/372, 410.3; 310/103, 310/104; 384/114, 115, 292, 313
See application file for complete search history.

(56) References Cited

U.S. PATENT DOCUMENTS

| | | | |
|---|---|---|---|
| 6,208,512 B1 * | 3/2001 | Goldowsky et al. ........ | 361/699 |
| 6,580,610 B2 * | 6/2003 | Morris et al. ............... | 361/699 |
| 6,600,649 B1 * | 7/2003 | Tsai et al. .................... | 361/697 |
| 6,945,314 B2 * | 9/2005 | Farrow et al. ............. | 165/80.3 |
| 7,124,811 B2 * | 10/2006 | Crocker et al. ........ | 165/104.33 |

FOREIGN PATENT DOCUMENTS

| | | | |
|---|---|---|---|
| JP | 2004251474 A | * | 9/2004 |
| TW | 584263 Y | | 7/2002 |
| TW | 577588 Y | | 5/2003 |

* cited by examiner

*Primary Examiner*—Michael Datskovskiy
(74) *Attorney, Agent, or Firm*—Birch, Stewart, Kolasch & Birch, LLP (57) ABSTRACT

A liquid-cooling heat dissipation module. The liquid-cooling heat dissipation module circularly dissipates heat from a heat source. The liquid-cooling heat dissipation module includes a fan, a pump, a heat sink, and a guide member. The pump is attached to the fan and driven by the fan. The heat sink is coupled to the fan, and has an opening for receiving the pump. A guide member is disposed in the opening of the heat sink and communicates with the pump. The guide member has a through hole and a guide passage formed on the surface of the guide member. Power provided by the fan, the working fluid in the liquid-cooling heat dissipation module circulates through the through hole, the pump and the guide passage to dissipate heat.

31 Claims, 11 Drawing Sheets

LIQUID-COOLING HEAT DISSIPATION MODULE

BACKGROUND OF THE INVENTION

1. Field of the Invention

The invention relates to a liquid-cooling heat dissipation module.

2. Discussion of Related Art

Computer's operating efficiency and functional demand are in distinct progress nowadays. With processing speeds increasing, CPUs and other electronic elements of a computer can experience increased temperatures caused by high-frequency oscillation and electromagnetic effect during a period of operation. If the temperature of the CPU or other electronic parts are not lowered timely, the electronic parts would be damaged and thus affecting the overall efficiency. Air cooling system and water cooling system can be used to dissipate heat. The air cooling system utilizes a heat sink attached to a heat source which generates heat to be conducted to fins formed on the heat sink. By blowing cool air to the fins on the heat sink, air flow generated by a fan dissipates the heat. However, this design presents height/weight limitations regarding the interior of the system. In addition, when the air cooling system is used with CPUs at high wattage (above 130 W), a high-speed fan is needed, thereby increasing noise levels or lowering efficiency of heat dissipation.

Figure 1:
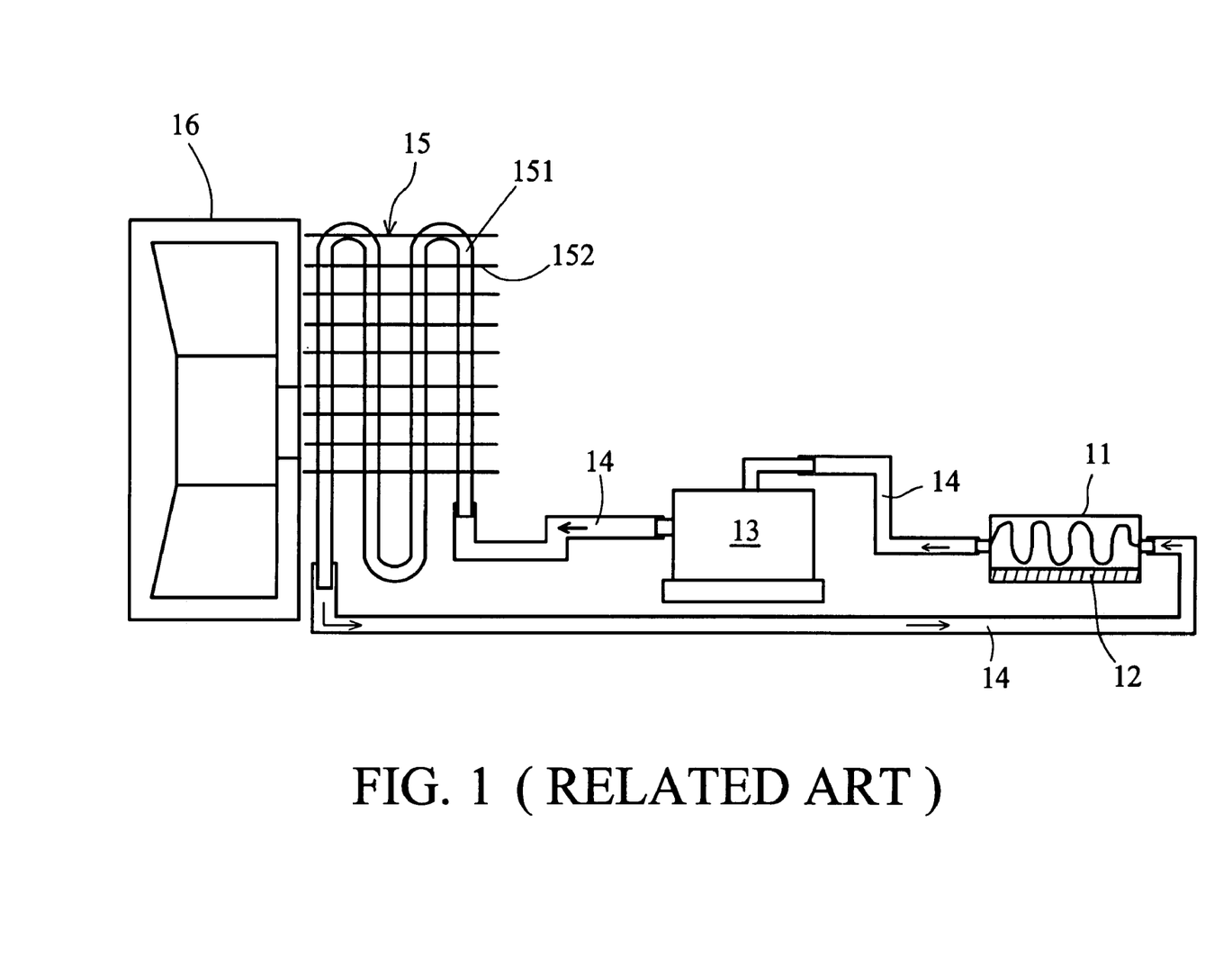
FIG. 1 is a schematic diagram of a conventional water-cooling heat dissipation system.

In high-level systems, blowing air directly to the heat produced by the CPU is not sufficient to effectively dissipate heat. A water cooling system must be used to help take away the heat by providing the necessary surface area to achieve sufficient heat dissipation. This method of heat dissipation requires a separate pump for circulating cool water and hot water. FIG. 1 depicts a conventional water cooling system used in a high-level system. The bottom of a copper base 11 is attached to the surface of a CPU 12 to rapidly conduct heat from the CPU 12 to the copper base 11. An S-shaped passage is formed in the copper base. A pump 13 conducts cool water to the S-shaped passage via a tube 14. Water enters from the right inlet of the S-shaped passage and out through the left outlet of the S-shaped passage, dissipating heat produced by the CPU 12 (as shown by the arrows in the drawing). Water in the tube 14 absorbs heat generated by the CPU 12, and the pump 13 sends the heated water into a heat pipe 151 of a heat sink 15, whereby the heat is transmitted to a plurality of fins 152. Finally, a fan 16 blows cool air to exhaust the accumulated heat from the fins 152. Heated water cools and flows back to the copper base 11. The system continuously circulates water to dissipate heat generated by the CPU 12.

Nevertheless, the water cooling system requires many tubes or pipes, and there is a possible water leakage at where the two tubes connect. In addition, water supply and ventilation are also main issues. Furthermore, the system requires a lot of space, compromising current trends in miniaturization. Numerous parts and complicated fabrication of the system also cause substantial increases in manufacturing costs and time.

SUMMARY OF THE INVENTION

The objective of the invention is to provide a liquid-cooling heat dissipation module in which power from a motor is shared by a fan and a pump. The module is assembled as a whole to substantially conserve fabrication costs and overall volume, with enhanced reliability.

Accordingly, a liquid-cooling heat dissipation module comprises a fan, a pump, a heat sink, and a guide member. The pump is attached to the fan, and is driven by the fan. The heat sink is coupled to the fan and has an opening for receiving the pump. The guide member, communicating with the pump, is disposed in the opening of the heat sink and has a through hole. A guide passage is formed on a surface of the guide member. A working fluid in the module flows circularly through the through hole, the pump, and the guide member to dissipate heat.

The guide member, fitted tightly to the opening of the heat sink, is made of plastic, aluminum, or metal. The guide passage has a spiral pattern, a striped pattern, a twilled pattern, a toothed pattern, a stepped pattern, or other similar patterns. Preferably, the opening of the heat sink has a smooth inner surface. When the guide member is inserted tightly into the opening, the guide passage is formed between the inner surface of the opening and an outer surface of the guide member. Alternatively, the inner surface of the opening may comprise a passage corresponding to the shape of the guide passage. When the guide member is inserted tightly into the opening, the guide passage is formed between the inner surface of the opening and the outer surface of the guide member.

The heat sink has an inlet and an outlet. The inlet communicates with the through hole, and the outlet communicates with the guide passage. The liquid-cooling heat dissipation module further comprises a conductive base attached to the heat source. Two ends of a tube respectively connect to the inlet and the outlet of the heat sink. The working fluid, through the tube, conducts heat away from the heat source.

The heat sink further comprises an injecting hole for filling the working fluid. The liquid-cooling heat dissipation module further comprises a buffer valve to be tightly inserted into the injecting hole. The buffer valve is a toothed structure. An upper portion of the buffer valve has an axial movement and a lower portion is tightly fitted to an inner surface of the injecting hole, and is made of soft rubber.

The liquid-cooling heat dissipation module further comprises a cap for sealing an end of the opening of the heat sink. Preferably, the cap is thermo-conductive or metallic material. A surface of the cap attaches to the heat source.

Preferably, the fan and the pump are driven by a single motor.

In a variant embodiment of the invention, the liquid-cooling heat dissipation module further comprises a first magnetic portion disposed on top of a hub of the fan. The fan further comprises a metal shell, with the first magnetic portion disposed in a space between an inner top surface of the hub and a top surface of the metal shell.

In another variant embodiment, the fan comprises a metal shell, and a hole is formed in a top portion of the hub. The first magnetic portion is disposed in the hole and supported by the metal shell.

Alternatively, the liquid-cooling heat dissipation module may further comprise a first magnetic portion disposed under a base of the fan.

The pump further comprises a second magnetic portion and a fixed seat. The fixed seat is coupled to the fan, with a space to receive the second magnetic portion. When the first magnetic portion rotates along with a rotor of the fan, an axial or radial magnetic force is produced between the first and second magnetic portions rotating the second magnetic portion, circulating the working fluid in the pump. The fixed seat is connected to the fan by screwing, riveting, wedging, adhering or fusing with ultrasound.

Further, the pump comprises a cover attached to the fixed seat. The second magnetic portion is seated in a space between the cover and the fixed seat. An O-ring is disposed at where the cover and the fixed seat connect.

The second magnetic ring is a plastic-magnetic ring coated with a layer of plastic, or a plastic-magnetic combination made by injection molding.

In another variant embodiment, the fan may comprise a shaft extending out of the base. The first magnetic portion is disposed on the extending end of the shaft. The first magnetic portion comprises a magnetic-conductive plate and a magnetic ring. The magnetic ring is attached and fixed to the magnetic-conductive plate.

In another variant embodiment, the fan may comprise a first magnetic portion, and the pump may comprise a second magnetic portion. The second magnetic portion is disposed in a notch formed in a base of the fan. When the first magnetic portion of the fan rotates, a radial magnetic force is produced between the first and the second magnetic portion rotating the second magnetic portion, circulating the working fluid in the pump.

According to another exemplary embodiment of the present invention, the liquid-cooling heat dissipation module comprises a fan, a pump, a heat sink and a guide member. The heat sink has an opening, and one end of the opening is coupled to the pump while the other end of the opening is covered by a cap. The guide member is disposed in the opening of the heat sink and communicates with the pump. A working fluid in the module, driven by the pump, flows circularly in a sealed space formed between the pump, the guide member, the heat sink, and the cap, to dissipate heat from the heat source.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 2:
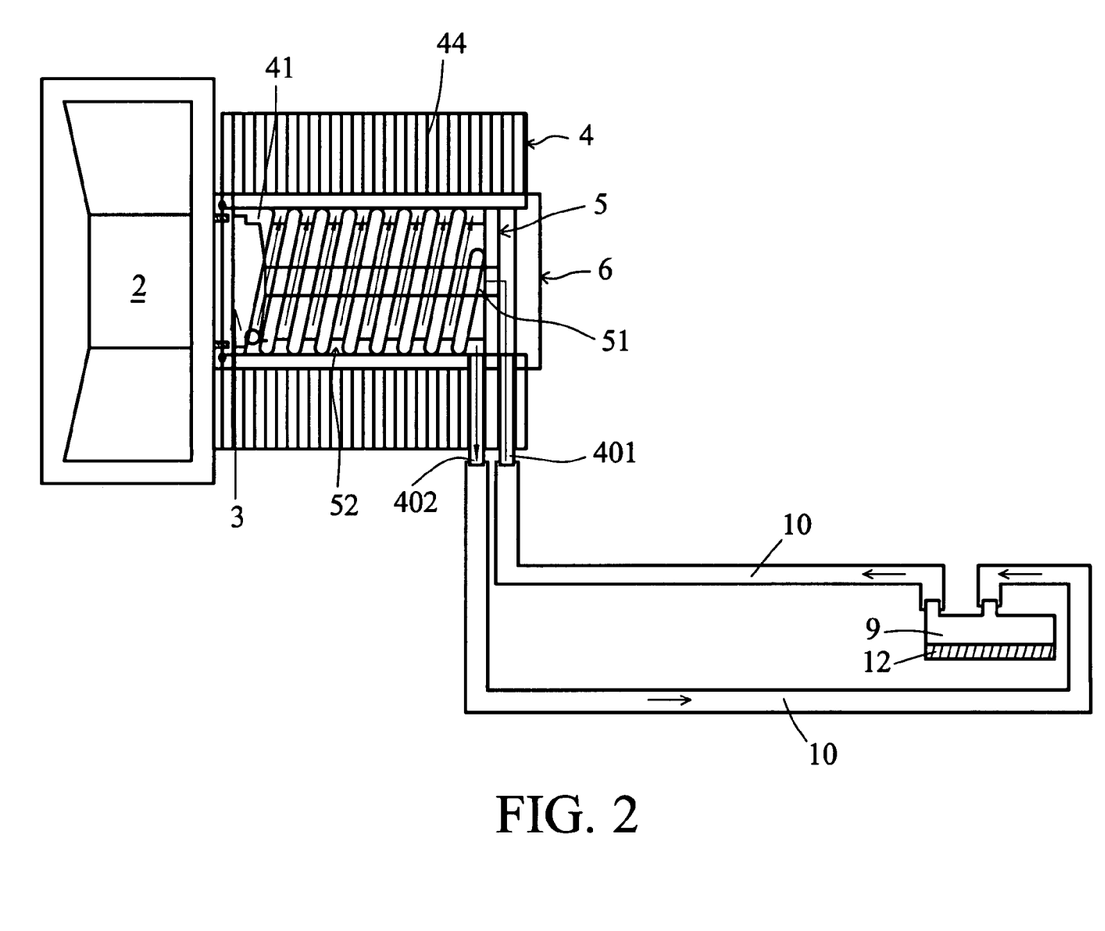
FIG. 2 is a sectional view of a first embodiment of a liquid-cooling heat dissipation module.

The present invention provides a liquid-cooling heat dissipation module by combining a fan 2, a pump 3, and a heat sink 4. As shown in FIG. 2, the bottom of a conductive base 9, connected with a tube 10, attaches to a heat source 12 (such as a CPU) to dissipate heat from the heat source 12. The liquid-cooling heat dissipation module includes a fan 2, a pump 3, a heat sink 4, and a guide member 5. The pump 3 attaches to the fan 2. The heat sink 4 couples to the fan 2 and has a central opening 41 receiving the pump 3. The guide member 5 is disposed in the opening 41 of the heat sink 4. The guide member 5 is made of plastic, aluminum, or metal. A through hole 51 is formed at the center of the guide member 5, and a spiral guide passage 52 is formed on an outer surface of the guide member 5. To assemble the liquid-cooling heat dissipation module, the guide member 5 fits tightly into the opening 41 of the heat sink 4. One end of the opening 41 of the heat sink 4 is coupled to the fan 2 and the pump 3, and the other end of the opening 41 of the heat sink 4 is sealed with a cap 6.

The bottom of the heat sink 4 has an inlet 401, which communicates with the through hole 51 of the guide member 5 to receive heated working fluid (for example, water) leaving the heat source 12. A bottom of the heat sink 4 has an outlet 402 communicating with the bottom end of the spiral guide passage 52. When the fan 2 and the pump 3 rotate, the heated working fluid enters into the through hole 51 of the guide member 5, and is drawn along the spiral guide passage 52 formed between an outer surface of the guide member 5 and a smooth inner surface of the opening 41 of the heat sink 4, then to the bottom of the heat sink 4 (i.e. a side close to the cap 6). As the heated working fluid flows through the through hole 51 and the guide passage 52 of the guide member 5, the heat carried by the heated working fluid is then conducted to fins 44 of the heat sink 4. Air flow from the fan 2 then dissipates heat from the fins 44. The working fluid flowed to the bottom of the guide passage 52 now has a lowered temperature, and flows out through the outlet 402 to return to the heat source 12. Constant circulation continues accordingly to dissipate the heat while the heat source 12 is in operation, as indicated by the arrows shown in FIG. 2.

The spiral guide passage 52 is interchangeable with a twilled guide passage, or a striped guide passage. However, the pattern of the guide passage is not limited, and stepped, toothed or other similar patterns may be used. The material of the guide member 5 is also interchangeable with aluminum, the same material used for heat sink 4. Other than the smooth inner surface, the inner surface of the opening 41 of the heat sink 4 may have a concave passage corresponding to the guide passage 52 of the guide member 5. When the guide member 5 is fitted tightly into the opening 41 of the heat sink 4, the guide passage 52 is formed between the outer surface of the guide member 5 and the inner surface of the opening 41 of the heat sink 4.

Figure 3A:
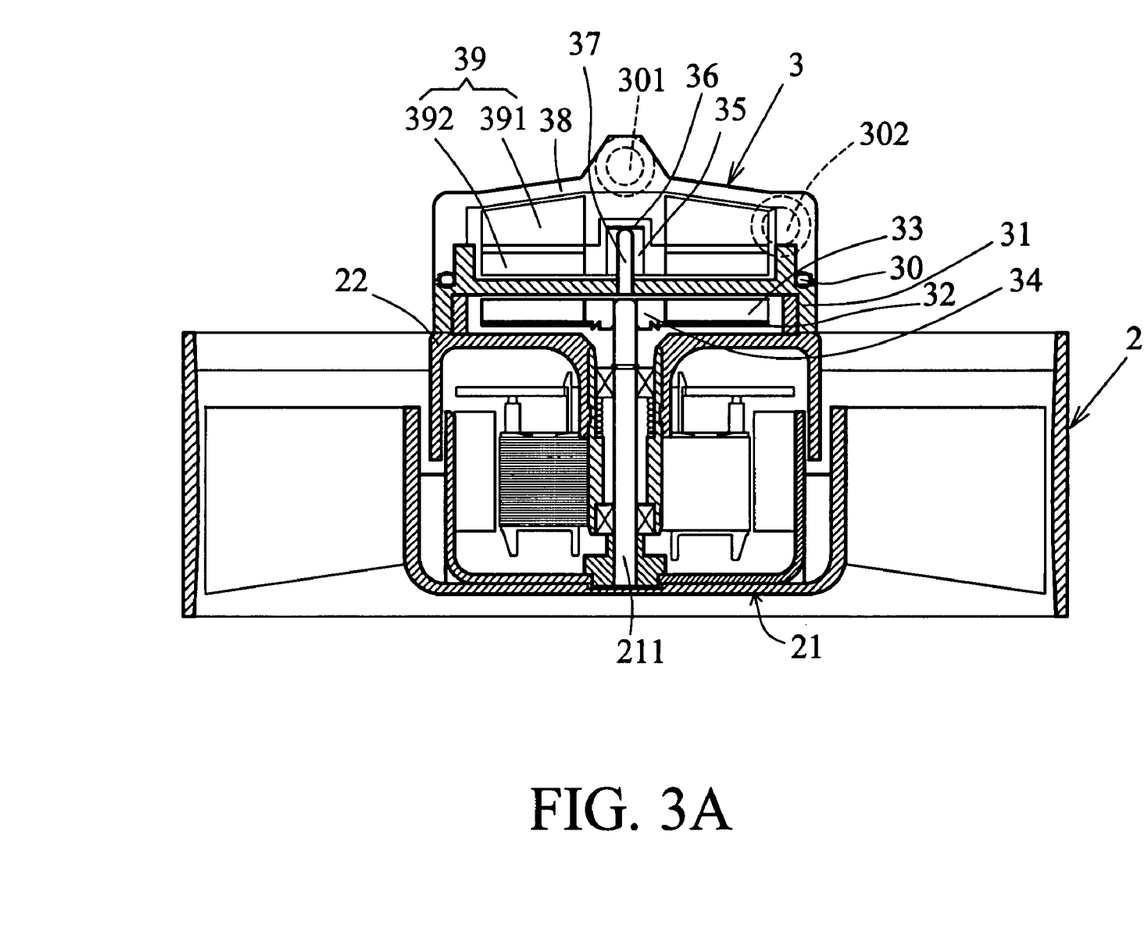
FIG. 3A is a sectional view of a variant embodiment of the liquid-cooling heat dissipation module, showing connection of a fan and a pump.

A description about the connection of the fan 2 and the pump 3 is given in detail. FIG. 3A shows a first embodiment of the present invention, specifically connection of the fan 2 and the pump 3. The fan 2 includes a rotor 21, and a base 22 bearing the rotor 21. One end of a shaft 211 of the rotor 21 extends out of the base 22. The pump 3 includes a fixed seat 31, attached to the bottom of the base 22 close to an air outlet or inlet of the fan 2. The fixed seat 31 and the base 22 are connected by screwing, wedging, riveting, adhering or fusing with ultrasound. Between one side of the fixed seat 31 and the base 22, a first space is formed to receive a first magnetic portion. The first magnetic portion includes a magnetically conductive sheet 32 and a magnetic ring 33. The magnetic ring 33 is attached and fixed tightly on the magnetically conductive sheet 32. The magnetically conductive sheet 32 and the magnetic ring 33 are connected to a portion of the shaft 211 by a copper sleeve 34. As a result, when the shaft 211 rotates, the magnetically conductive sheet 32, the magnetic ring 33, and the copper sleeve 34 rotate along with the shaft 211. The pump 3 has a central hole for receiving a ceramic bearing 35 and a wear-resistant plate 36. On the other side of the fixed seat 31, a ceramic axle 37 is fixed in the center of the fixed seat 31, and supported by the ceramic bearing 35. The pump 3 has a cover 38 covering the fixed seat 31. The cover 38 and the fixed seat 31 are connected by screwing, wedging, riveting, adhering, or fusing with ultrasound. To contain working fluid securely, an O-ring 30 secures the connection of the cover 38 and the fixed seat 31. Between the cover 38 and the fixed seat 31, a second space is formed to receive a second magnetic portion 39 of the pump 3. The second magnetic portion 39 includes a guide blade 391 and a magnetic ring 392. The working fluid enters from an inlet 301 at the top of the pump 3 and exits through an outlet 302 at the bottom of the pump 3.

Figure 3B:
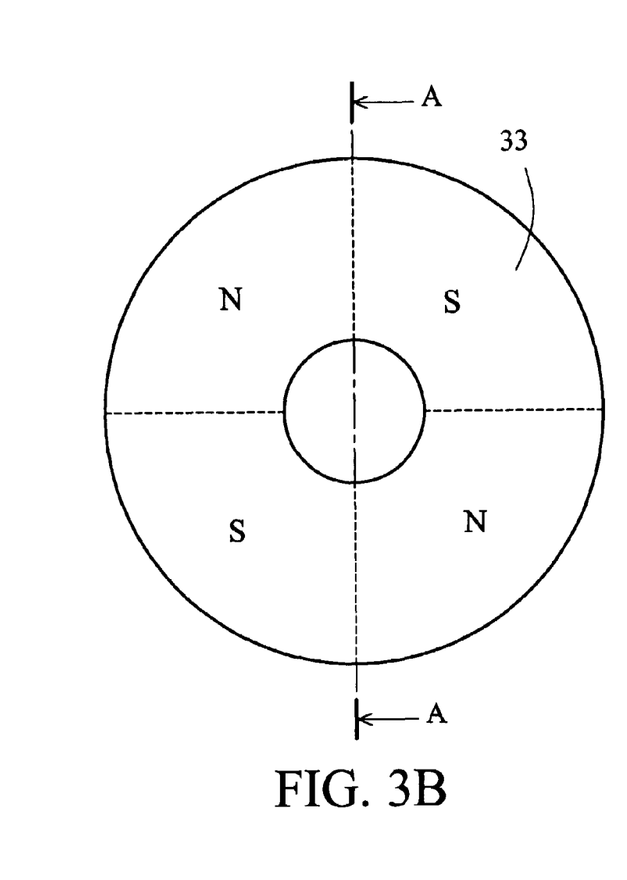
FIG. 3B is a schematic view of a first magnetic portion and a second magnetic portion in FIG. 3A showing the arrangement of magnetized sections.
Figure 3C:
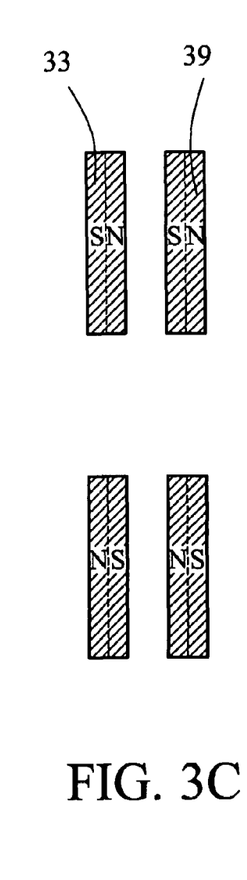
FIG. 3C is a sectional view along line A-A in FIG. 3B.

The present invention is to unify the fan 2 and the pump 3, and omit one extra motor, so that the fan 2 and the pump 3 can share one motor for operating power. When the motor rotates, power is transferred to the first magnetic portion through the shaft 211. A gap is formed between the first magnetic portion and the second magnetic portion 39. When the first magnetic portion rotates with the shaft 211, an axial magnetic attraction (as shown in FIGS. 3B and 3C) formed between the first magnetic portion and the second magnetic portion 39 synchronously rotates the guide blade 391 of the pump 33 to circulate the working fluid in the pump. In this embodiment, the first magnetic portion and the second magnetic portion 39 respectively have more than two magnetized sections. The first magnetic portion 32, 33 and the second magnetic portion 39 have four magnetized sections. A staggered angle is formed when the north-pole section of the first magnetic portion 33 corresponds to the south-pole section of the second magnetic portion 39, enabling the second magnetic portion 39 to rotate with the first magnetic portion 33, so as to drive the guide blade 391 to rotate.

Figure 4A:
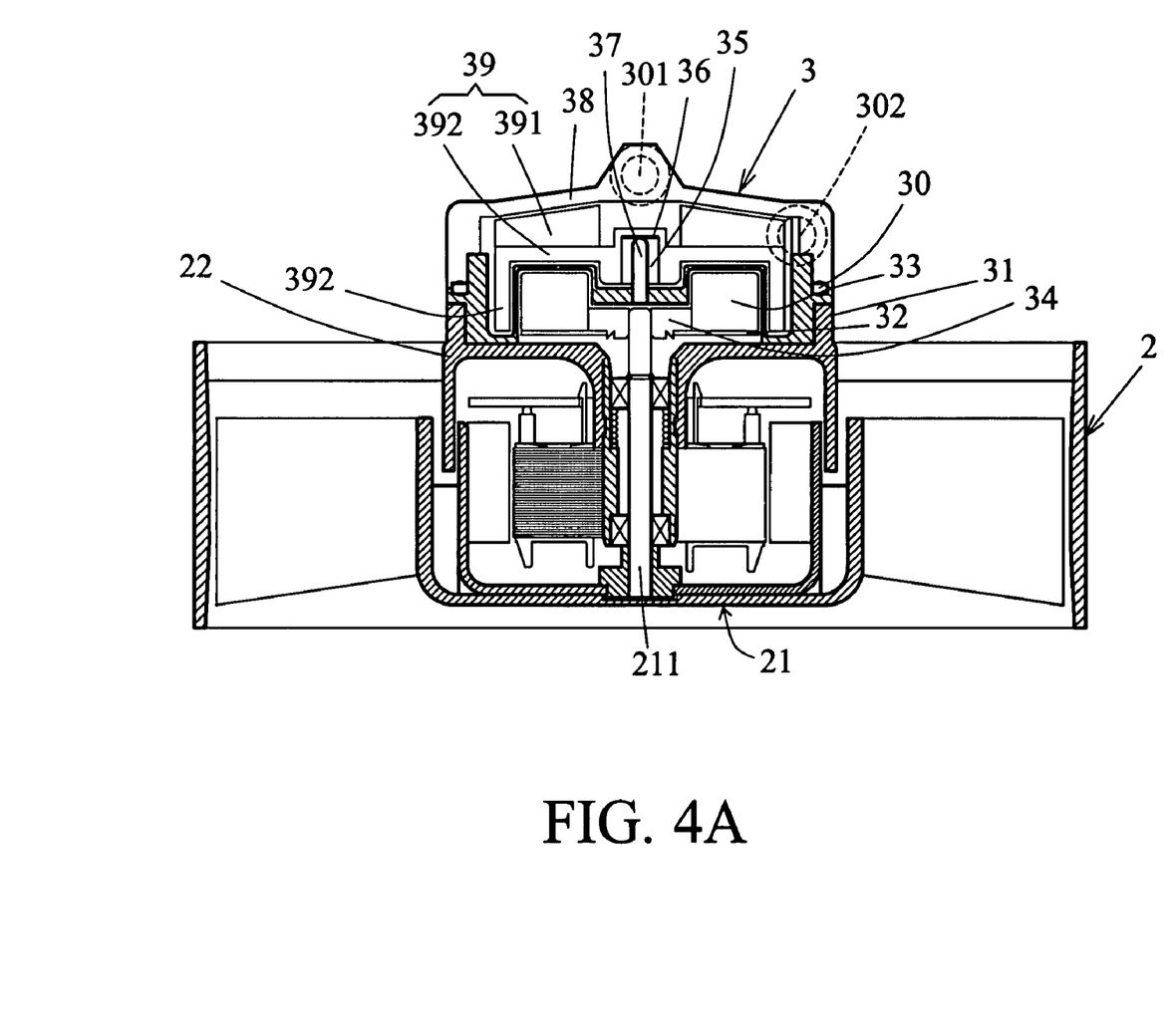
FIG. 4A is a sectional view of another variant embodiment of the liquid-cooling heat dissipation module, showing connection of the fan and the pump.
Figure 4B:
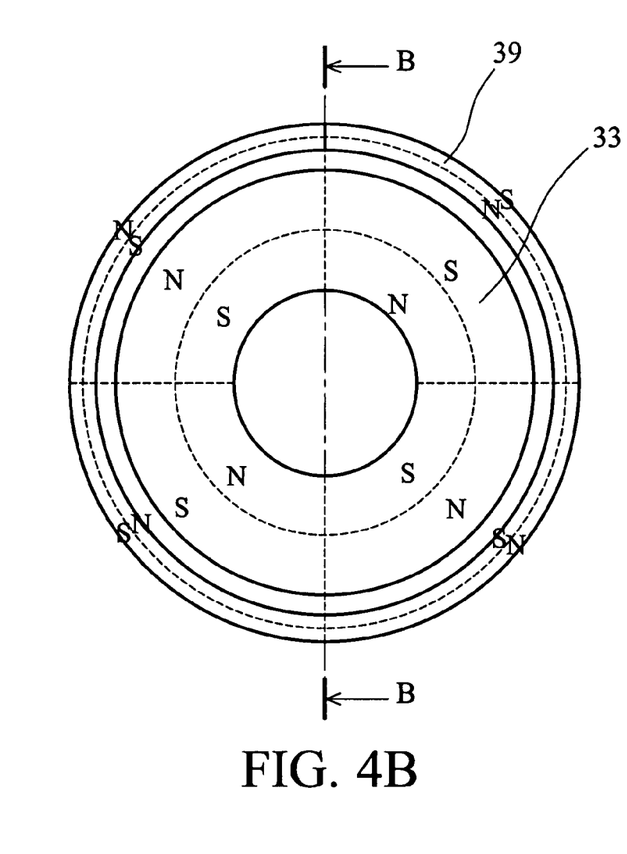
FIG. 4B is a schematic view of the first magnetic portion and the second magnetic portion in FIG. 4A showing the arrangement of magnetized sections.
Figure 4C:
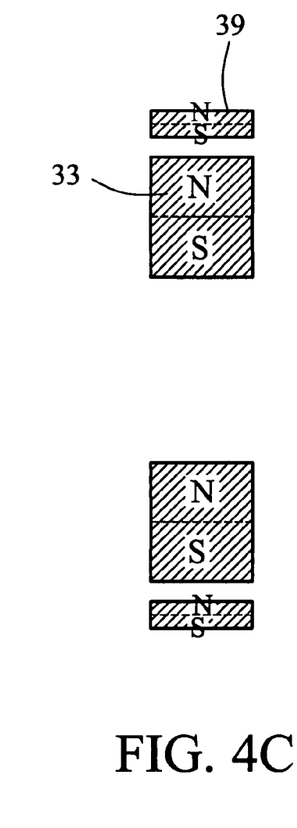
FIG. 4C is a sectional view along line B-B in FIG. 4B.

Other than the utilization of axial magnetic force in the first embodiment, radial magnetic force may also be applied. FIG. 4A shows a second embodiment of the invention, specifically connection of the fan 2 and the pump 3. The structure of this embodiment is similar to that in FIGS. 3A to 3C, differing in that the first magnetic portion 32, 33 and the second magnetic portion 39 have a radial disposition. The outer diameter of the first magnetic portion 32, 33 is smaller than that of the second magnetic portion 39. The second magnetic portion 39 is disposed radially outside the first magnetic portions 32, 33, creating radially magnetic attraction. The magnetized sections are configured as shown in FIGS. 4B and 4C.

Figure 5:
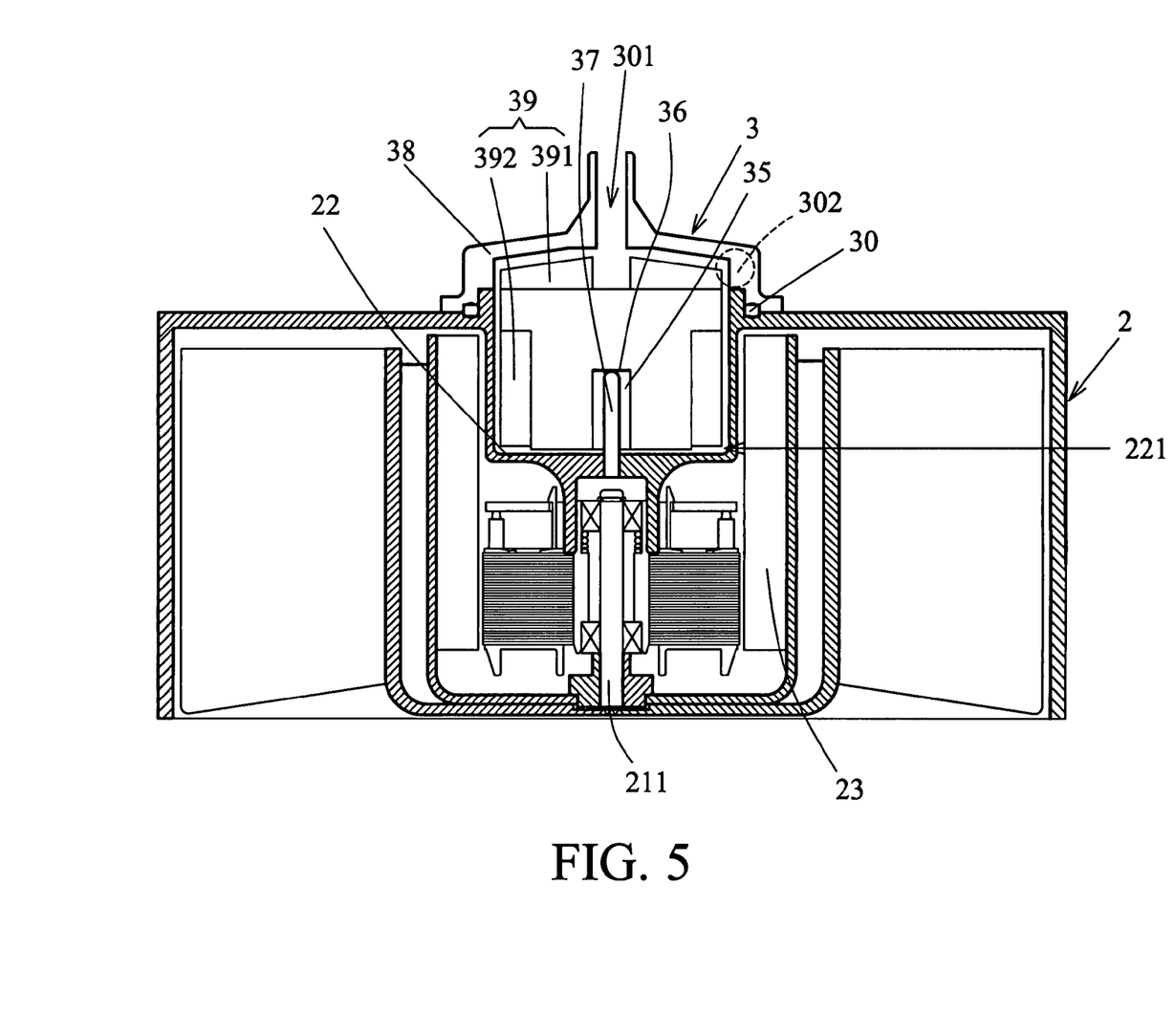
FIG. 5 is a sectional view of another variant embodiment of the liquid-cooling heat dissipation module, showing connection of the fan and the pump.

FIG. 5 shows a third embodiment of the invention, specifically the connection of the fan 2 and the pump 3. The structure of this embodiment is similar to the embodiments in FIGS. 3A to 3C and 4A to 4C, differing only in that the base 22 has a notch 221 toward the fan 2 for receiving the magnetic ring 392 of the second magnetic portion 39 therein. At the same time, the magnetic ring 23 in the motor of the fan 2 elongates to replace the first magnetic portion in the embodiments shown in FIGS. 3A, 3B, 4A and 4B. The magnetic ring 23 and the magnetic ring 392 are disposed radially to generate a radial magnetic force such that the magnetic ring 23 not only reacts with the stator (silicon steel) and the coil of the fan 2 to rotate the fan 2, but also directly produces magnetic forces with the second magnetic portion 39 to rotate the guide blade 391.

Figure 6:
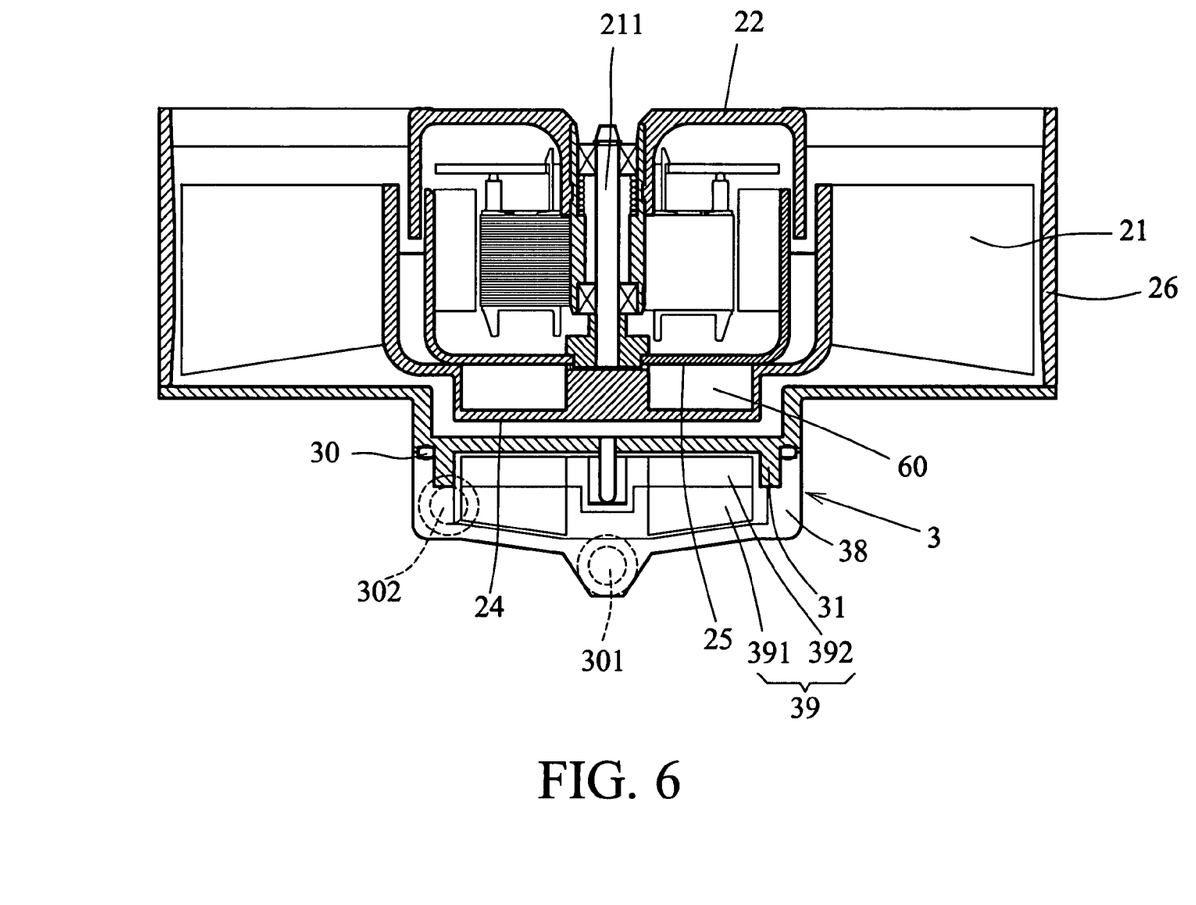
FIG. 6 is a sectional view of another variant embodiment of the liquid-cooling heat dissipation module, showing connection of the fan and the pump.

In the above embodiments shown in FIGS. 3-5, the pump 3 is disposed on the bottom of the base 22 of the fan 2. However, the pump 3 can also be disposed on the other side of the fan, i.e. the opposite side of the base 22. FIG. 6 shows a forth embodiment of the invention. The first magnetic portion 60 is disposed in a space between the top inner surface of the hub 24 of the rotor 21 and the top surface of the metal shell 25. The fixed seat 31 of the pump 3 is mounted on the frame 26 of the fan 2, and fixed by screwing. Alternatively, the fixed seat 31 is fixed to the heat sink provided. The second magnetic portion 39 is disposed in the notch of the fixed seat 31, and covered by the cover 38. The rest of the structure is the same as previously described and is not discussed here. When the first magnetic portion 60 rotates along with the rotor 21, the axial magnetic attraction rotates the second magnetic portion 39 for the continued circulation of the working fluid in the pump 3 to dissipate heat.

Figure 7:
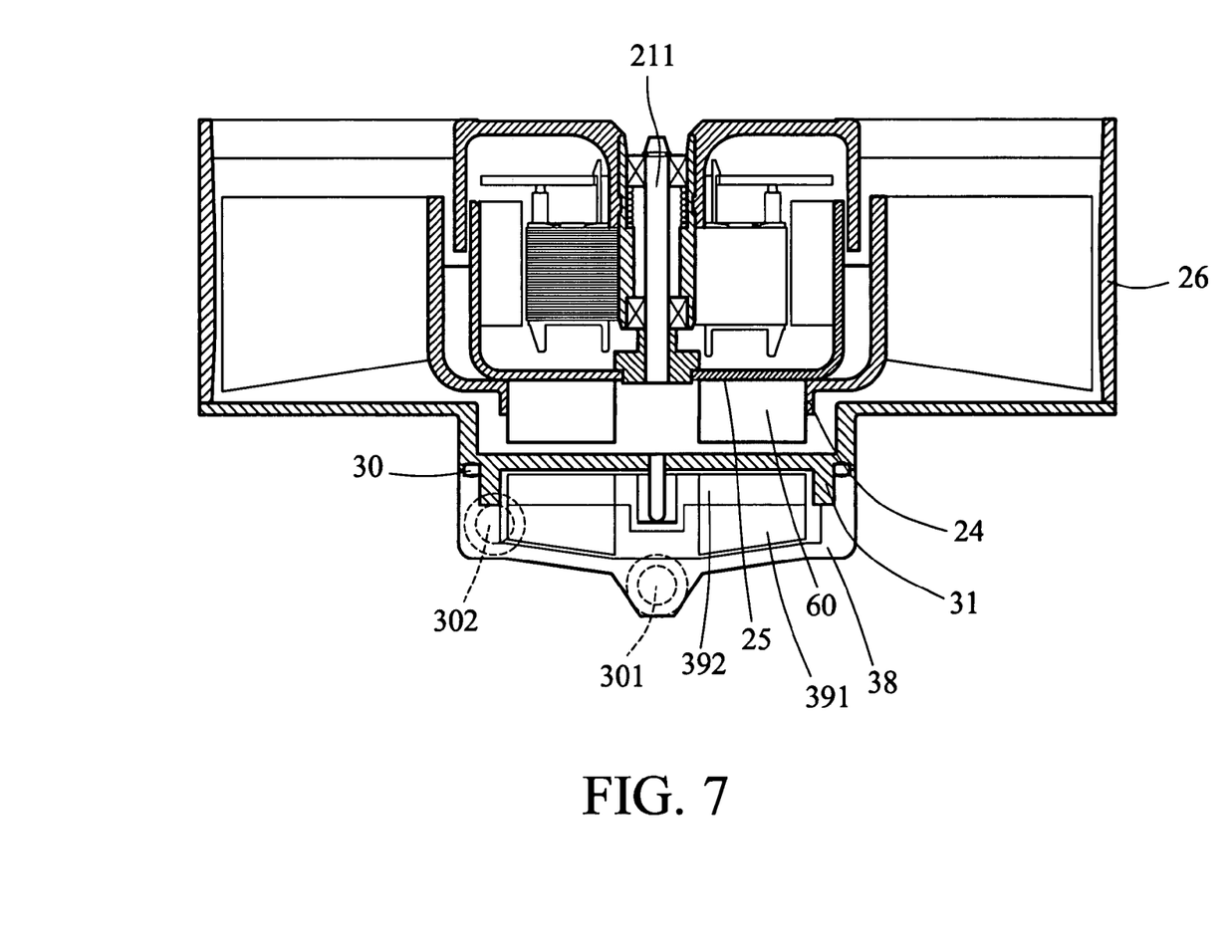
FIG. 7 is a sectional view of another variant embodiment of the liquid-cooling heat dissipation module showing connection of the fan and the pump.

FIG. 7 shows a fifth embodiment of the invention, specifically connection of the fan 2 and the pump 3. This embodiment is similar to the embodiment in FIG. 6, differing only in that the top portion of the hub 24 has a hole for receiving the first magnetic portion 33 carried by the metal shell 25. The rest of the structure is the same as described in FIG. 6, and the detail is omitted here.

It should be noted that all the combinations of the fan 2 and the pump 3 in the variant embodiments of FIGS. 3-7 are applicable in the liquid-cooling heat dissipation module of FIG. 2.

In the embodiments described, the guide blade 391 and the magnetic ring 392 are fabricated separately, and then combined to form a second magnetic portion 39. Alternatively, the magnetic ring 392 can be coated with plastic to constitute the second magnetic portion 39, or the second magnetic portion 39 can be a combination of plastic and magnet formed by injection molding. The shape of the guide blade can be redially straight structure, or redially curved structure. The working fluid flows into the pump 3 from the inlet 301 located on a central portion of the top of the pump 3, the guide blade 391 rotates to produce a centrifugal force for guiding the working fluid peripherally, and the working fluid converges toward the side outlet 302 to exit.

Figure 8:
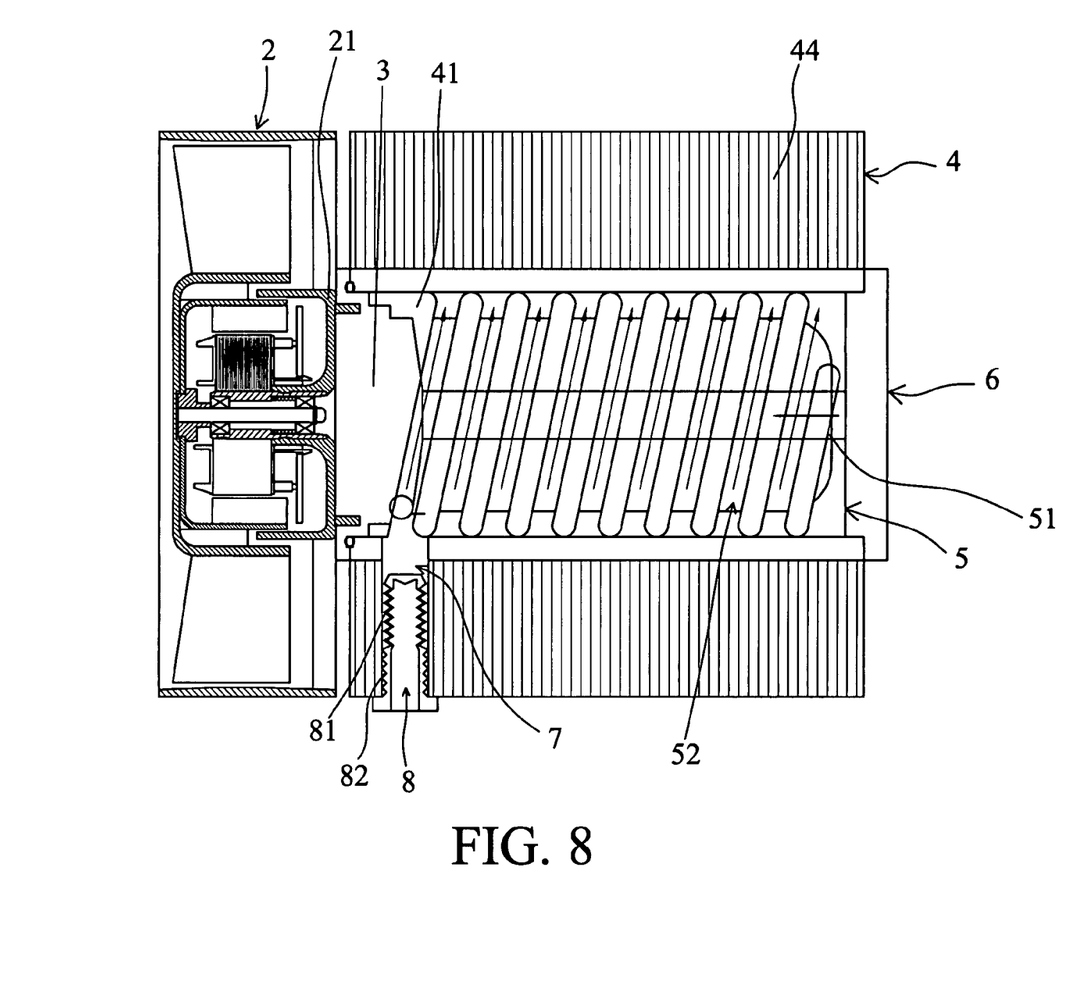
FIG. 8 is a sectional view of the second embodiment of the liquid-cooling heat dissipation module.

FIG. 8 shows another variant embodiment of the present invention similar to the embodiment in FIG. 2, but with no inlet and outlet formed at the bottom of the heat sink 4. An injecting hole 7 is formed on one end of the opening 41 of the heat sink 4 (i.e. the end near the fan and the pump). After addition of working fluid, a buffer valve 8 is inserted tightly into the injecting hole 7. The buffer valve 8 has a toothed structure, an upper portion 81 of the buffer valve 8 is capable of axial movement; a lower portion 82 of the buffer valve 8 is tightly fitted to the inner surface of the injecting hole 7. The buffer valve 8 is soft rubber, not only providing prevention of working fluid leakage, but also automatically buffering of the inner pressure caused by expansion and contraction of the guide passage 52. Moreover, a cap 6 can be made of thermo-conductive or metallic material and is disposed at the other end of the opening 41 of the heat sink 4 to seal the opening 41, and an outer surface of the cap is directly attached to a heat source. Heat produced by the heat source attached to the outer surface of the cap 6 is conducted to the cap 6 to heat up the working fluid. The heated working fluid flows through the through hole 51 of the guide member 5, around the pump 3, and then into the guide passage 52 formed between the guide member 5 and an inner surface of the opening 41 of the heat sink 4. At this time, the heat in the working fluid is rapidly conducted to the fins 44 of the heat sink 4. Airflow from the fan 2 then dissipates heat from fins 44 of the heat sink 4. The working fluid has been cooled by the time arriving at the bottom of the heat sink 4 (i.e. near the cap). Finally, the working fluid circulates in the module, in the direction shown by arrows in FIG. 8. The combinations of the fan 2 and the pump 3 in FIG. 2-7 are applicable to this liquid-cooling heat dissipation module.

Figure 9:
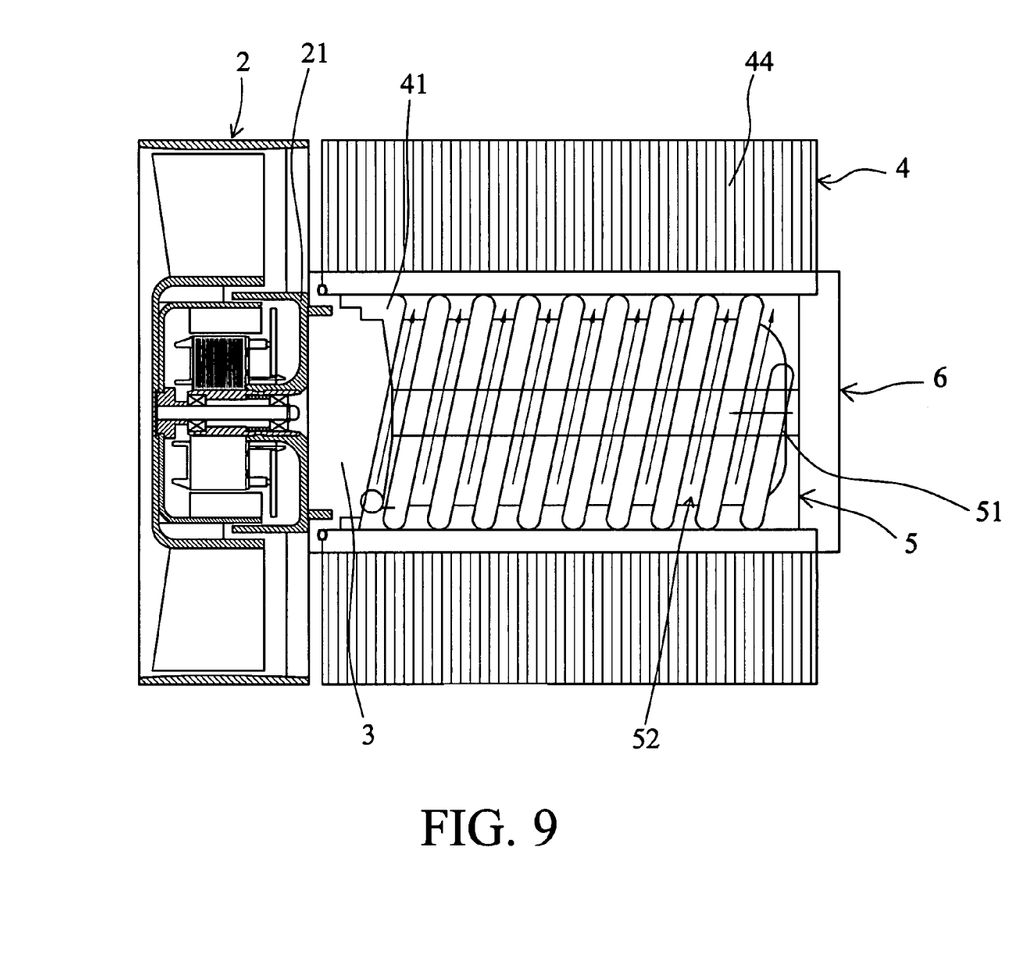
FIG. 9 is a sectional view of the third embodiment of the liquid-cooling heat dissipation module.

FIG. 9 shows another variant embodiment of the invention, similar to the embodiment in FIG. 8. One end of the opening 41 of the heat sink 4 is attached to a pump 3 while the other end is sealed by a cap 6. The guide member 5 is fitted tightly into the opening 41. A sealed space is formed between the pump 3, the guide member 5, the heat sink 4, and the cap 6 to allow the working fluid to circulate in the space. An outer surface of the cap 6 is attached tightly to a heat source for rapid transfer of heat produced by the heat source to the cap 6, thereby heating up the working fluid. The heated working fluid flows through the through hole 51 of the guide member 5, the pump 3, and the guide passage 52 formed between the guide member 5 and the inner surface of the opening 41 of the heat sink 4. At this time, the heat from the working fluid is rapidly conducted to the fins 44 of the heat sink 4. A separate fan or blower connected or attached to the pump 3 creates air flow to the fins 44 for dissipating heat from the fins 44 of the heat sink 4. The working fluid has been cooled by the time arriving at the bottom of the heat sink 4 (i.e. near the cap 6). Finally, the working fluid circulates in the module. The combinations of the fan 2 and the pump 3 in FIGS. 3-8 are applicable to this liquid-cooling heat dissipation module.

In conclusion, the invention incorporates a fan and a pump, eliminating the need for individual motors, such that the fan 2 and the pump 3 share one motor for the operating power. Further, integration of the fan, pump and heat sink into one or two parts reduces the number of tubes required, or even eliminates the need for tubes in the module. Reliability is thus substantially increased and the working fluid leakage is minimized. Furthermore, the decreased number of parts conserves material and minimizes overall volume. The invention is assembled in a module, so every section of the module can be directly replaced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A liquid-cooling heat dissipation module for dissipating heat produced by a heat source, comprising:
    a fan;
    a pump attached to the fan and driven by the fan;
    a heat sink coupled to the fan and comprising an opening for receiving the pump; and
    a guide member disposed in the opening of the heat sink, communicating with the pump and comprising a through hole and a guide passage, wherein the guide passage is formed on a surface of the guide member, and a working fluid in the module flows circularly through the through hole, the pump and the guide member to dissipate heat.

2. The liquid-cooling heat dissipation module as claimed in claim 1, wherein the guide member is fitted tightly to the opening of the heat sink, and is made of plastic, aluminum, or metallic material.

3. The liquid-cooling heat dissipation module as claimed in claim 1, wherein the guide passage has a spiral pattern, a striped pattern, a twilled pattern, a toothed pattern, a stepped pattern, or other similar patterns.

4. The liquid-cooling heat dissipation module as claimed in claim 1, wherein the opening of the heat sink has a smooth inner surface, and the guide passage is formed between an inner surface of the opening of the heat sink and the guide member inserted tightly into the opening, or the inner surface of the opening of the heat sink comprises a passage corresponding to the shape of the guide passage, and the guide passage is formed between the inner surface of the opening and the guide member inserted tightly into the opening.

5. The liquid-cooling heat dissipation module as claimed in claim 1, wherein the heat sink has an inlet communicating with the through hole, and an outlet communicating with the guide passage.

6. The liquid-cooling heat dissipation module as claimed in claim 5, further comprising:
    a conductive base attached to the heat source; and
    a tube, communicating with the conductive base and respectively connected to the inlet and the outlet of the heat sink, wherein the working fluid flows through the tube to take away heat from the heat source when the heat source is in operation.

7. The liquid-cooling heat dissipation module as claimed in claim 1, wherein the heat sink has an injecting hole for filling the working fluid.

8. The liquid-cooling heat dissipation module as claimed in claim 7, further comprising a buffer valve to be tightly inserted into the injecting hole.

9. The liquid-cooling heat dissipation module as claimed in claim 8, wherein the buffer valve is a toothed structure, an upper portion of which provides an axial movement and a lower portion is tightly fitted to an inner surface of the injecting hole.

10. The liquid-cooling heat dissipation module as claimed in claim 8, wherein the buffer valve is made of soft rubber.

11. The liquid-cooling heat dissipation module as claimed in claim 1, further comprising a cap to seal one end of the opening of the heat sink.

12. The liquid-cooling heat dissipation module as claimed in claim 11, wherein the cap is thermo-conductive or metallic material, and a surface of the cap attaches to the heat source.

13. The liquid-cooling heat dissipation module as claimed in claim 1, wherein the fan and the pump are driven by a single motor.

14. The liquid-cooling heat dissipation module as claimed in claim 1, further comprising a first magnetic portion disposed on top of a hub of the fan.

15. The liquid-cooling heat dissipation module as claimed in claim 14, wherein the fan further comprises a metal shell, and the first magnetic portion is disposed in a space between an inner top surface of the hub and a top surface of the metal shell.

16. The liquid-cooling heat dissipation module as claimed in claim 14, wherein the fan further comprises a metal shell, and a top portion of the hub comprises a hole for receiving the first magnetic portion carried by the metal shell.

17. The liquid-cooling heat dissipation module as claimed in claim 1, further comprising a first magnetic portion disposed under a base of the fan.

18. The liquid-cooling heat dissipation module as claimed in claim 17, wherein the pump comprises a second magnetic portion and a fixed seat, the fixed seat is coupled to the fan and comprises a space for receiving the second magnetic portion, whereby when the first magnetic portion rotates along with the fan, an axial or radial magnetic force produced between the first and second magnetic portions rotates the second magnetic portion, circulating the working fluid in the pump.

19. The liquid-cooling heat dissipation module as claimed in claim 18, wherein the pump further comprises a cover attached to the fixed seat, and the second magnetic portion is received between the cover and the fixed seat.

20. The liquid-cooling heat dissipation module as claimed in claim 19, wherein the second magnetic portion is a plastic-magnetic ring coated with a layer of plastic, or a plastic-magnetic combination formed by injection molding.

21. The liquid-cooling heat dissipation module as claimed in claim 18, wherein the fan comprises a shaft and an end of the shaft extends out of the base to be coupled with the first magnetic portion.

22. The liquid-cooling heat dissipation module as claimed in claim 21, wherein the first magnetic portion comprises a magnetic-conductive plate and a magnetic ring, and the magnetic ring is attached and fixed to the magnetic-conductive plate.

23. The liquid-cooling heat dissipation module as claimed in claim 1, wherein the fan comprises a first magnetic portion, and the pump comprises a second magnetic portion disposed in a notch formed in a base of the fan, whereby when the first magnetic portion of the fan rotates, a radial magnetic force produced between the first and second magnetic portions rotates the second magnetic portion, circulating the working fluid in the pump.

24. A liquid-cooling heat dissipation module for dissipating heat produced by a heat source, comprising:
a pump;
a heat sink comprising an opening, wherein one end of the opening is coupled to the pump and the other end of the opening is covered by a cap; and
a guide member disposed in the opening of the heat sink and communicating with the pump, wherein a working fluid in the liquid-cooling heat dissipation module is driven by the pump to flow circularly in a sealed space formed by the pump, the guide member, the heat sink and the cap to dissipate heat from the heat source.

25. The liquid-cooling heat dissipation module as claimed in claim 24, wherein the guide member is made of plastic, aluminum, or metallic material, and is fitted tightly to the opening of the heat sink.

26. The liquid-cooling heat dissipation module as claimed in claim 24, wherein the guide member comprises a through hole, and a guide passage is formed on the surface of the guide member.

27. The liquid-cooling heat dissipation module as claimed in claim 26, wherein the guide passage has a spiral pattern, a striped pattern, a twilled pattern, a toothed pattern, a step pattern, or other similar patterns.

28. The liquid-cooling heat dissipation module as claimed in claim 26, wherein the opening of the heat sink comprises a smooth inner surface, and the guide passage is formed between the inner surface of the opening and the guide member inserted tightly into the opening, or the inner surface of the opening comprises a passage corresponding to the shape of the guide passage formed between the inner surface of the opening and the guide member inserted tightly in the opening.

29. The liquid-cooling heat dissipation module as claimed in claim 24, wherein the cap is made of thermo-conductive or metallic material, and an outer surface of the cap is attached tightly to the heat source.

30. The liquid-cooling heat dissipation module as claimed in claim 24, further comprising a fan or blower providing air flow blowing toward the heat sink.

31. The liquid-cooling heat dissipation module as claimed in claim 30, wherein the fan is attached to the pump, and the fan and the pump are driven by a single motor.

* * * * *